United States Patent
Taniguchi et al.

(10) Patent No.: US 8,319,228 B2
(45) Date of Patent: Nov. 27, 2012

(54) RESIN COMPOSITION FOR OPTICAL SEMICONDUCTOR DEVICE, OPTICAL-SEMICONDUCTOR-DEVICE LEAD FRAME OBTAINED USING THE SAME, AND OPTICAL SEMICONDUCTOR DEVICE

(75) Inventors: Takashi Taniguchi, Osaka (JP); Kazuhiro Fuke, Osaka (JP); Hiroshi Noro, Osaka (JP); Hisataka Ito, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 12/875,515

(22) Filed: Sep. 3, 2010

(65) Prior Publication Data

US 2011/0058776 A1   Mar. 10, 2011

(30) Foreign Application Priority Data

Sep. 7, 2009   (JP) .................................. 2009-205752
May 24, 2010  (JP) .................................. 2010-118513

(51) Int. Cl.
*H01L 35/24* (2006.01)
*H01L 29/26* (2006.01)

(52) U.S. Cl. ................ 257/79; 257/40; 257/81; 257/99; 257/E21.26; 257/E21.261

(58) Field of Classification Search .................... 257/40, 257/79, 81, 99, E21.26, E21.261
See application file for complete search history.

(56) References Cited

U.S. PATENT DOCUMENTS

| 7,498,085 | B2 * | 3/2009 | Kashiwagi et al. | 428/447 |
| 8,013,057 | B2 * | 9/2011 | Taguchi et al. | 524/588 |
| 2004/0159850 | A1 * | 8/2004 | Takenaka | 257/98 |
| 2007/0142574 | A1 * | 6/2007 | Kodama | 525/476 |
| 2008/0298063 | A1 * | 12/2008 | Hayashi | 362/249 |
| 2009/0239997 | A1 * | 9/2009 | Taguchi et al. | 524/588 |

FOREIGN PATENT DOCUMENTS

| JP | 2002-232017 A | 8/2002 |
| JP | 2002-283498 A | 10/2002 |
| JP | 2009021394 A * | 1/2009 |

OTHER PUBLICATIONS

Chinese Office Action dated Feb. 17, 2012 issued by the State Intellectual Property of P.R. China in counterpart Chinese Patent Application No. 201010275972.3.

Chinese Office Action dated Aug. 28, 2012 issued by the Intellectual Property Office of P.R. China in corresponding Chinese Patent Application No. 201010275972.3.

* cited by examiner

*Primary Examiner* — Jerome Jackson, Jr.
*Assistant Examiner* — Jose R Diaz
(74) *Attorney, Agent, or Firm* — Sughrue Mion, PLLC

(57) ABSTRACT

The present invention relates to a resin composition for optical semiconductor devices, the resin composition including the following ingredients (A) to (D): (A) an epoxy resin; (B) a curing agent; (C) a polyorganosiloxane; and (D) a white pigment.

6 Claims, 2 Drawing Sheets

*Fig. 1a* CONVENTIONAL
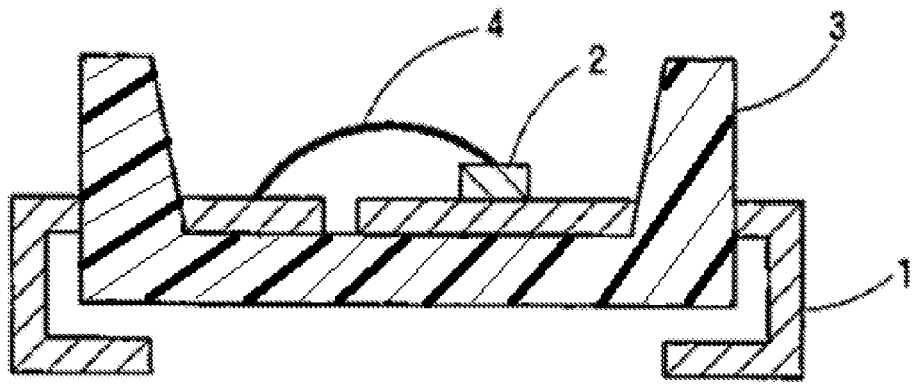

RESIN COMPOSITION FOR OPTICAL SEMICONDUCTOR DEVICE, OPTICAL-SEMICONDUCTOR-DEVICE LEAD FRAME OBTAINED USING THE SAME, AND OPTICAL SEMICONDUCTOR DEVICE

FIELD OF THE INVENTION

The present invention relates to a resin composition for optical semiconductor devices which serves as a material for forming a resin layer around an optical semiconductor element, and relates to an optical-semiconductor-device lead flame obtained using the resin composition and an optical semiconductor device.

BACKGROUND OF THE INVENTION

Conventional optical semiconductor devices including an optical semiconductor element mounted therein, for example, have a configuration including a metallic lead frame 1, an optical semiconductor element 2 mounted thereon, and a resin wall formed from a resin layer 3 so as to surround the circumference of the optical semiconductor element 2, as shown in FIG. 1a. In FIG. 1a, numeral 4 denotes a bonding wire which electrically connects an electrode circuit (not shown) formed on the metallic lead frame 1 to the optical semiconductor element 2, the bonding wire being disposed according to need.

When such an optical semiconductor device is produced, the resin layer 3 is formed by the injection molding of a thermoplastic resin represented by a polyimide resin (PPA) or the like. A white pigment is generally incorporated into the thermoplastic resin to reflect the light emitted by the optical semiconductor element 2 and impart directivity thereto (see patent document 1).

On the other hand, in the case where high heat resistance is required, a ceramic material containing sintered alumina is mainly used to form a part in place of the resin layer 3 (see patent document 2).

However, the formation of the part corresponding to the resin layer 3 from the ceramic material is problematic in view of the suitability for mass production and cost of such packages, etc. Because of this, the resin layer 3 is generally formed using the thermoplastic resin.

Patent Document 1: JP-A-2002-283498
Patent Document 2: JP-A-2002-232017

SUMMARY OF THE INVENTION

However, in the case where thermoplastic resins are used as materials for forming the resin layer 3, the resins are required to have thermal resistance to reflow environments in surface mount packages such as the optical semiconductor device, because the solder materials for use in mounting are becoming lead-free solder materials, which have higher melting points. Consequently, although there are desires for thermal deformation resistance at soldering temperatures, for thermal discoloration resistance, and for heat resistance for longer period of time required due to increases in the power of optical semiconductor elements 2, use of the thermoplastic resins results in discoloration, etc. at high temperatures and this poses problems such as a decrease in the efficiency of light reflection.

An object of the invention, which has been achieved in view of such circumstances, is to provide a resin composition for optical semiconductor devices which has excellent thermal discoloration resistance and excellent light degradation resistance and to which satisfactory light-reflecting properties can be imparted. Another object of the invention is to provide an optical-semiconductor-device lead frame obtained using the resin composition. Still another object thereof is to provide an optical semiconductor device.

Namely, the present invention relates to the following items (1) to (7).

(1) A resin composition for optical semiconductor devices, the resin composition including the following ingredients (A) to (D):
(A) an epoxy resin;
(B) a curing agent;
(C) a polyorganosiloxane; and
(D) a white pigment.

(2) The resin composition for optical semiconductor devices according to item (1), in which a cured material obtained from the resin composition has a light reflectivity of 80% or higher at a wavelength of 450 nm to 800 nm.

(3) The resin composition for optical semiconductor devices according to item (1) or (2), in which the ingredient (C) is contained in an amount of 5 to 60% by weight based on all organic components including the ingredients (A) to (C).

(4) The resin composition for optical semiconductor devices according to any one of items (1) to (3), in which the ingredient (D) is titanium oxide.

(5) The resin composition for optical semiconductor devices according to any one of items (1) to (4), which further contains an inorganic filler in addition to the ingredients (A) to (D).

(6) A lead frame for an optical semiconductor device, having one or more optical-semiconductor-element mounting regions and including a resin wall,
in which a circumference of at least one of the element mounting region is surrounded by the resin wall formed from the resin composition for optical semiconductor devices according to any one of items (1) to (5).

(7) An optical semiconductor device including the lead frame for an optical semiconductor device according to item (6) and an optical semiconductor element mounted on a predetermined position in the lead frame.

The present inventors diligently made investigations in order to obtain a resin composition for optical semiconductor packages which is inhibited from suffering thermal deformation or discoloration and is excellent in soldering heat resistance, long-term high-temperature heat resistance, and light degradation resistance. As a result, they have found that use of a thermosetting resin composition including an epoxy resin in combination with a polyorganosiloxane makes it possible to attain a combination of the excellent properties possessed by the epoxy resin and the high thermal discoloration resistance and light degradation resistance which are characteristics of the polyorganosiloxane and renders fabrication with a mold by, for example, transfer molding possible. This is advantageous also from the standpoint of suitability for mass production. The desired objects are thus accomplished, and the invention has been achieved.

As shown above, the invention provides a resin wall for an optical semiconductor package which includes a metallic lead frame or substrate and an optical semiconductor element mounted thereon, in which the resin wall is formed around the circumference of the optical semiconductor element, the resin wall being formed from a material for resin wall formation which includes the resin composition including an epoxy resin [ingredient (A)], a curing agent [ingredient (B)], a polyorganosiloxane [ingredient (C)], and a white pigment [ingredient (D)]. Because of this, the resin wall is excellent in soldering heat resistance and long-term high-temperature heat resistance, exhibits excellent performance also with respect to light degradation resistance, and renders excellent light-reflecting properties possible. Consequently, in an optical semiconductor device obtained using the resin composition for forming the resin wall, an excellent light reflectivity attributable to the resin wall is maintained over a long period of time, and hence, the resin wall can sufficiently perform the function thereof.

When the cured material obtained from the resin composition has a light reflectivity of 80% or higher at a wavelength of 450 nm to 800 nm, it is possible to lower the power of the light-emitting element while maintaining the same brightness with respect to light of each color, owing to the high reflectivity. As a result, the effect of retaining heat resistance regarding high-temperature discoloration, etc. can be prolonged. In addition, thermal decreases in adhesion to encapsulating resins and thermal deformation of encapsulating resins can be prevented.

When the content of the polyorganosiloxane [ingredient (C)] is in the range of 5 to 60% by weight based on all organic components including the ingredients (A) to (C), not only even better heat resistance and light degradation resistance are obtained but also a excellent cured resin composition is obtained.

When titanium oxide is used as the white pigment [ingredient (D)], excellent whiteness and light-reflecting properties are obtained because titanium oxide has excellent dispersibility, chemical stability, etc.

Furthermore, when an inorganic filler is used together with those ingredients, a reduction in the liner expansion coefficient and a further improvement in flowability are realized.

BRIEF DESCRIPTION OF THE DRAWING

FIG. 1a is a sectional view diagrammatically illustrating a configuration of a conventional optical semiconductor device.

DETAILED DESCRIPTION OF THE INVENTION

Figure 1B:
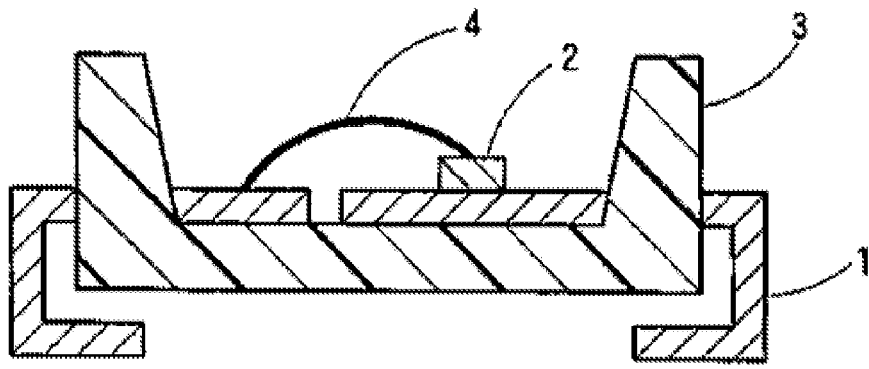
FIG. 1b is a sectional view diagrammatically illustrating a configuration of the optical semiconductor device of the invention.

As stated above, the resin composition for optical semiconductor devices (hereinafter referred to also as "resin composition") of the invention is used as a material for forming, for example, the resin layer 3 (or resin wall 3a) of the optical semiconductor device shown in FIG. 1b or in any of FIG. 2 to FIG. 4, which will be described later. The resin composition is one obtained using an epoxy resin (ingredient A), a curing agent (ingredient B), a polyorganosiloxane (ingredient C), and a white pigment (ingredient D), and is usually supplied in a liquid or powder state or in the form of tablets obtained by tableting the powder.

Examples of the epoxy resin (ingredient A) include bisphenol A epoxy resins, bisphenol F epoxy resins, bisphenol S epoxy resins, novolac epoxy resins such as phenol-novolac epoxy resins and cresol-novolac epoxy resins, alicyclic epoxy resins, nitrogenous-ring epoxy resins such as monoglycidyl isocyanurate, diglycidyl isocyanurate, triglycidyl isocyanurate, and hydantoin epoxy resins, hydrogenated bisphenol A epoxy resins, hydrogenated bisphenol F epoxy resins, aliphatic epoxy resins, glycidyl ether epoxy resins, diglycidyl ethers of alkyl-substituted bisphenols or the like, glycidylamine epoxy resins obtained by the reaction of polyamines, e.g., diaminodiphenylmethane and isocyanuric acid, with epichlorohydrin, linear aliphatic epoxy resins obtained by oxidizing olefin bonds with a peracid, e.g., peracetic acid, biphenyl epoxy resins, which are mainly used as the type giving cured resins with a low water absorption, dicyclic epoxy resins, and naphthalene epoxy resins. These may be used alone or in combination of two or more thereof. To use alicyclic epoxy resins and triglycidyl isocyanurate either alone or in combination is preferred of those epoxy resins because of their excellent transparency, discoloration resistance, and melt-mixability with the polyorganosiloxane. For the same reason, the diglycidyl esters of dicarboxylic acids such as phthalic acid, tetrahydrophthalic acid, hexahydrophthalic acid, methyltetrahydrophthalic acid, nadic acid, and methylnadic acid are also suitable. Examples of the epoxy resin further include glycidyl esters having an alicyclic structure formed by the hydrogenation of an aromatic ring, such as nuclear-hydrogenated trimellitic acid and nuclear-hydrogenated pyromellitic acid.

The epoxy resin (ingredient A) may be solid or liquid at room temperature. In general, however, it is preferred to use an epoxy resin having an average epoxy equivalent of 90 to 1,000. In the case of solid epoxy resins, it is preferred to use one having a softening point of 160° C. or lower. The reasons for these are as follows. Too low epoxy equivalents may result in cases where the resin composition gives a brittle cured material. When the epoxy resin has too high an epoxy equivalent, the resin composition tends to give a cured material having a lowered glass transition temperature (Tg).

Examples of the curing agent (ingredient B) include acid anhydride curing agents and isocyanuric acid derivative curing agents. Examples of the acid anhydride curing agents include phthalic anhydride, maleic anhydride, trimellitic anhydride, pyromellitic anhydride, hexahydrophthalic anhydride, tetrahydrophthalic anhydride, methylnadic anhydride, nadic anhydride, glutaric anhydride, dimethylglutaric anhydride, diethylglutaric anhydride, methylhexahydrophthalic anhydride, and methyltetrahydrophthalic anhydride. These may be used alone or in combination of two or more thereof. Of these curing agents, it is preferred to use phthalic anhydride, hexahydrophthalic anhydride, tetrahydrophthalic anhydride, or methylhexahydrophthalic anhydride. Preferred acid anhydride curing agents are colorless or light-yellow curing agents.

Examples of the isocyanuric acid derivative curing agents include 1,3,5-tris(1-carboxymethyl) isocyanurate, 1,3,5-tris (2-carboxyethyl) isocyanurate, 1,3,5-tris(3-carboxypropyl) isocyanurate, and 1,3-bis(1-carboxyethyl) isocyanurate. These may be used alone or in combination of two or more thereof. Preferred isocyanuric acid derivative curing agents are colorless or Light-yellow curing agents.

Curing agents (ingredient B) such as the acid anhydride curing agents and isocyanuric acid derivative curing agents may be used alone or in combination of two or more thereof. Preferred curing agents (ingredient B) are ones which are colorless or light-yellow.

The proportion of the epoxy resin (ingredient A) to the curing agent (ingredient B) is set so that the amount of active groups (acid anhydride groups or carboxyl groups) in the curing agent (ingredient B) which are capable of reacting with an epoxy group is preferably 0.5 to 1.5 equivalents, more preferably 0.7 to 1.2 equivalents, per equivalent of the epoxy groups contained in the epoxy resin (ingredient A). The reasons for this are as follows. In case where the amount of active groups is too small, there is a tendency that the resin composition has a reduced curing rate and gives a cured material having a lowered glass transition temperature (Tg). In case where the amount of active groups is too large, moisture resistance tends to decrease.

Curing agents for epoxy resins, other than the curing agents described above, may be used as the curing agent (ingredient B) according to the purpose and use thereof. Examples of such other curing agents include phenol curing agents, amine curing agents, curing agents obtained by partly esterifying the acid anhydride curing agents with an alcohol, and carboxylic acids such as hexahydrophthalic acid, tetrahydrophthalic acid, and methylhexahydrophthalic acid. These may be used alone, or a combination of the curing agent described above and a phenol curing agent may be used. For example, when a carboxylic acid curing agent is used in combination with another curing agent, this can heighten the curing rate and can improve productivity. Also in the case where these curing agents are used, the proportion thereof may be the same as the proportion (equivalent ratio) of the curing agent (ingredient B) shown above.

The polyorganosiloxane (ingredient C) to be used in combination with the ingredient A and ingredient B may be any polyorganosiloxane which is mixable with the epoxy resin (ingredient A), and use can be made of various polyorganosiloxanes, i.e., polyorganosiloxanes which are solid or liquid at room temperature. The polyorganosiloxane to be used in the invention may be any polyorganosiloxane capable of being evenly dispersed on the order of nanometer in the cured material to be obtained from the resin composition.

Examples of such a polyorganosiloxane (ingredient C) include ones in which the siloxane units serving as a component thereof are represented by the following general formula (1). Examples thereof include polyorganosiloxanes which have at least one silicon-bonded hydroxyl or alkoxy group per one molecule thereof and in which at least 10% by mole of the silicon-bonded monovalent hydrocarbon groups (R) are substituted or unsubstituted aromatic hydrocarbon groups.

$$R_m(OR^1)_n SiO_{(4-m-n)/2} \quad (1)$$

In formula (1), R is a substituted or unsubstituted, saturated, monovalent hydrocarbon group having 1 to 18 carbon atoms, and the Rs may be the same or different; $R^1$ is a hydrogen atom or an alkyl group having 1 to 6 carbon atoms, and the $R^1$s may be the same or different; and m and n each are an integer of 0 to 3.

Examples of the unsubstituted, saturated, monovalent hydrocarbon group represented by R in formula (1) include linear or branched alkyl groups such as methyl, ethyl, propyl, isopropyl, n-butyl, isobutyl, t-butyl, pentyl, isopentyl, hexyl, isohexyl, heptyl, isoheptyl, octyl, isooctyl, nonyl, and decyl, cycloalkyl groups such as cyclopentyl, cyclohexyl, cyclooctyl, dicyclopentyl, and decahydronaphthyl, and aromatic groups such as aryl groups, e.g., phenyl, naphthyl, tetrahydronaphthyl, tolyl, and ethylphenyl, and aralkyl groups, e.g., benzyl, phenylethyl, phenylpropyl, and methylbenzyl.

On the other hand, examples of the substituted, saturated, monovalent hydrocarbon group represented by R in formula (1) include hydrocarbon groups in which part or all of the hydrogen atoms have been replaced by a halogen atom, cyano group, amino group, epoxy group, etc. Specific examples thereof include substituted hydrocarbon groups such as chloromethyl, 2-bromoethyl, 3,3,3-trifluoropropyl, 3-chloropropyl, chlorophenyl, dibromophenyl, difluorophenyl, β-cyanoethyl, γ-cyanopropyl, and β-cyanopropyl.

From the standpoints of affinity for the epoxy resin (ingredient A) described above and the properties of the resin composition to be obtained, the polyorganosiloxane (ingredient C) is one in which R in formula (1) preferably is an alkyl group or an aryl group. When R is an alkyl group, more preferred alkyl groups are those having 1 to 3 carbon atoms which were shown above as examples. Especially preferred is methyl group. An especially preferred aryl group is phenyl group. In each siloxane unit or in the siloxane units, the groups represented by R in formula (1) may be the same or different.

It is preferred in the polyorganosiloxane (ingredient C) that at least 10% by mole of the silicon-bonded monovalent hydrocarbon groups (R) in the structures represented by formula (1) should be selected from aromatic hydrocarbon groups. The reason for this is as follows. In case where the amount of aromatic hydrocarbon groups is too small, this polyorganosiloxane has an insufficient affinity for epoxy resins. Because of this, dissolving or dispersing the polyorganosiloxane in an epoxy resin gives an opaque resin composition and this resin composition tends to give a cured material which does not bring about sufficient effects with respect to light degradation resistance and physical properties. The content of aromatic hydrocarbon groups, which produce such an effect, is more preferably 30% by mole or higher, especially preferably 40% by mole or higher. The upper limit of the content of aromatic hydrocarbon groups is 100% by mole.

$(OR^1)$ in formula (1) is a hydroxyl group or an alkoxy group. When $(OR^1)$ is an alkoxy group, examples of $R^1$ include the alkyl groups having 1 to 6 carbon atoms which were enumerated above as examples of the R described above. More specifically, examples of $R^1$ include methyl group, ethyl group, and isopropyl group. In each siloxane unit or in the siloxane units, the groups represented by $(OR^1)$ may be the same or different.

It is preferred that the polyorganosiloxane (ingredient C) should have at least one silicon-bonded hydroxyl or alkoxy group per one molecule thereof, that is, the polyorganosiloxane should have an $(OR^1)$ group of formula (1) in at least one of the siloxane units constituting the polyorganosiloxane. The reasons for this are as follows. In case where the polyorganosiloxane has neither the hydroxyl group nor the alkoxy group, this polyorganosiloxane has an insufficient affinity for epoxy resins. Furthermore, the resin composition obtained is less apt to give a cured material having sufficient physical properties, probably because the hydroxyl group or alkoxy groups perform some function in the curing reaction of the epoxy resin although the mechanism thereof is unclear. The amount of silicon-bonded hydroxyl or alkoxy groups in the polyorganosiloxane (ingredient C) is preferably set so as to be in the range of 0.1 to 15% by weight in terms of OH group amount, and is more preferably 1 to 10% by weight. The reasons for this are as follows. In case where the amount of hydroxyl groups or alkoxy groups is outside the range, this polyorganosiloxane has a poor affinity for the epoxy resin (ingredient A). Especially when the amount thereof is too large (for example, exceeds 15% by weight), there is the possibility that a self-dehydration reaction or an alcohol elimination reaction might occur.

In formula (1), m and n, which each indicate the number of repetitions, each are an integer of 0 to 3. The numbers m and n, which each indicate the number of repetitions, differ from siloxane unit to siloxane unit. The siloxane units constituting the polyorganosiloxane are explained in greater detail.

Examples thereof include units A1 to A4 represented by the following general formulae (2) to (5).

Unit A1: $(R)_3SiO_{1/2}$ (2)

Unit A2: $(R)_2(OR^1)_nSiO_{(2-n)/2}$ (3)

In formula (3), n is 0 or 1.

Unit A3: $(R)(O^1)_nSiO_{(3-n)/2}$ (4)

In formula (4), n is 0, 1, or 2,

Unit A4: $(OR^1)_nSiO_{(4-n)/2}$ (5)

In formula (5), n is an integer of 0 to 3.

In formulae (2) to (5), R is a substituted or unsubstituted, saturated, monovalent hydrocarbon group having 1 to 18 carbon atoms, and the Rs may be the same or different. $R^1$ is a hydrogen atom or an alkyl group having 1 to 6 carbon atoms, and the $R^1$s may be the same or different.

Namely, the siloxane units are classified according to m of formula (1): the case where m=3 corresponds to unit A1, which is represented by formula (2); the case where m=2 corresponds to unit A2, which is represented by formula (3); the case where m=1 corresponds to unit A3, which is represented by formula (4); and the case where m=0 corresponds to unit A4, which is represented by formula (5). Of these units, unit A1, which is represented by formula (2), is a structural unit which has only one siloxane bond and constitutes a terminal group. Unit A2, which is represented by formula (3), is a structural unit which, when n is 0, has two siloxane bonds and constitutes linear siloxane bonds. When n in unit A3, which is represented by formula (4), is 0 and when n in unit A4, which is represented by formula (5), is 0 or 1, then unit A2 is a structural unit which can have three or four siloxane bonds and contributes to a branched structure or a crosslinked structure.

In the polyorganosiloxane (ingredient C), it is preferred that the proportions of units A1 to A4, which are respectively represented by formulae (2) to (5), should have been set as shown below under (a) to (d).

(a) unit A1: 0 to 30% by mole
(b) unit A2: 0 to 80% by mole
(c) unit A3: 20 to 100% by mole
(d) unit A4: 0 to 30% by mole It is more preferred that the proportions of unit A1 and unit A4 should be 0% by mole, the proportion of unit A2 should be 5 to 70% by mole, and the proportion of unit A3 should be 30 to 100% by mole. Such proportion ranges are more preferred because by setting the proportions of units A1 to A4 so as to be within those ranges, the effect of being capable of imparting (maintaining) moderate hardness and an appropriate modulus of elasticity to the cured material is obtained.

The polyorganosiloxane (ingredient C) is constituted of those constituent units combined to one another or in a row. The polymerization degree of the polyorganosiloxane is preferably in the range of 6 to 10,000. The state of the polyorganosiloxane (ingredient C) depends on the polymerization degree and the crosslinking degree, and may be either liquid or solid.

The polyorganosiloxane (ingredient C), which has such siloxane units represented by formula (1), can be produced by a known method. For example, the polyorganosiloxane is obtained by subjecting at least one of an organosilane and an organosiloxane to a reaction, for example, hydrolysis in the presence of a solvent, e.g., toluene. In particular, a method in general use is to subject an organochlorosilane or an organoalkoxysilane to hydrolysis/condensation. The "organo" group is a group corresponding to the R in formula (1), such as an alkyl group or an aryl group. Units A1 to A4, which are represented by formulae (2) to (5), respectively correlate with the structures of the silanes used as starting materials. For example, in the case of chlorosilanes, use of a triorganochlorosilane gives unit A1, which is represented by formula (2), and use of a diorganodichlorosilane gives unit A2, which is represented by formula (3). Furthermore, use of an organochlorosilane gives unit A3, which is represented by formula (4), and use of tetrachlorosilane gives unit A4, which is represented by formula (5). In formulae (1) and (3) to (5), the silicon-bonded substituents represented by $(OR^1)$ are hydrolysis residues remaining uncondensed.

In the case where the polyorganosiloxane (ingredient C) is solid at ordinary temperature, the softening point (pour point) thereof is preferably 150° C. or lower, especially preferably 120° C. or lower, from the standpoint of melt mixability with the resin composition.

It is preferred that the content of the polyorganosiloxane (ingredient C) should be set so as to be in the range of 5 to 60% by weight based on all organic components including the ingredients (A) to (C). Especially preferably, the content thereof is in the range of 10 to 40% by weight in view of the fact that the polyorganosilxane heightens the linear expansion coefficient of the resin composition. The reasons for that range are as follows. In case where the content of ingredient C is too low, there is a tendency that heat resistance and light degradation resistance decrease. In case where the content of ingredient C is too high, there is a tendency that the resultant resin composition gives a cured material which itself is considerably brittle.

Examples of the white pigment (ingredient D) to be used together with the ingredients A to C described above include inorganic white pigments such as magnesium oxide, antimony oxide, titanium oxide, zirconium oxide, zinc oxide, white lead, kaolin, alumina, calcium carbonate, barium carbonate, barium sulfate, zinc sulfate, and zinc sulfide. These may be used alone or in combination of two or more thereof. Especially preferred of these is titanium oxide, with which an excellent light reflectivity is obtained. It is more preferred to use titanium oxide having an average particle diameter of 0.05 to 2.0 μm. Incidentally, the average particle diameter can be determined with, for example, a laser diffraction/scattering type particle size distribution analyzer.

The content of the white pigment (ingredient D) is preferably set so as to be in the range of 2 to 90% by weight based on the whole resin composition. From the standpoints of coloring properties and light reflectivity, it is more preferred to set the content thereof at a value in the range of 5 to 90% by weight based on the whole resin composition. The reasons for this are as follows. In case where the content of ingredient D is too low, there is a tendency that a sufficient light reflectivity is difficult to obtain. In case where the content of ingredient D is too high, there is a tendency that difficulties are encountered in producing the resin composition through kneading or the like because of a considerable increase in viscosity.

In the resin composition of the invention, an inorganic filler can be used in addition to the ingredients A to D for the purposes of reducing the linear expansion coefficient and improving flowability. Examples of the inorganic filler include a quartz glass powder, talc, silica powders such as a powder of fused silica and a powder of crystalline silica, alumina powder, aluminum nitride powder, and silicon nitride powder. Of these, it is preferred to use a silica powder from the standpoints of reducing the linear expansion coefficient, etc. Especially from the standpoints of high-loading characteristics and high flowability, it is preferred to use a spherical powder of fused silica. Although the particle diameter and particle diameter distribution of the inorganic filler are not particularly limited, it is preferred to select the particle diameter and distribution thereof so that a combination thereof with the particle diameter and particle diameter distribution of the white pigment (ingredient D) is effective in minimizing the occurrence of burrs when the resin composition of the invention is molded by transfer molding, etc. In particular, it is preferred to use an inorganic filler having an average particle diameter in the range of 5 to 60 μm, especially preferably having an average particle diameter in the range of 15 to 45 μm. The average particle diameter can be determined with, for example, a laser diffraction/scattering type particle size distribution analyzer.

It is preferred that the content of the inorganic filler should be set so that the total content of the white pigment (ingredient D) and the inorganic filler is 2 to 98% by weight based on the whole resin composition.

Various additives such as a curing accelerator, antioxidant, modifier, flame retardant, defoaming agent, leveling agent, and release agent can be suitably incorporated into the resin composition of the invention according to need in addition to the ingredient A to D and inorganic filler described above.

Examples of the curing accelerator include tertiary amines such as 1,8-diazabicyclo[5.4.0]undecane-7, triethylenediamine, tri-2,4,6-dimethylaminomethylphenol, N,N-dimethylbenzylamine, N,N-dimethylaminobenzene, and N,N-dimethylaminocyclohexane, imidazole compounds such as 2-ethyl-4-methylimidazole and 2-methylimdazole, phosphorus compounds such as triphenylphosphine, tetraphenylphosphonium tetraphenylborate, and tetra-n-butylphosphonium o,o-diethyl phosphorodithioate, quaternary ammonium salts, organic metal salts, and derivatives thereof. These may be used alone or in combination of two or more thereof. Preferred of these curing accelerators are tertiary amines, imidazole compounds, and phosphorus compounds. It is especially preferred to use phosphorus compounds, among these curing accelerators, in order to obtain a cured material which has a low degree of coloration and is transparent and tough.

It is preferred that the content of the curing accelerator should be set at 0.001 to 8.0% by weight based on the epoxy resin (ingredient A). More preferably, the content thereof is 0.01 to 3.0% by weight. The reasons for this are as follows. When the content of the curing accelerator is too low, there are cases where a sufficient curing-accelerating effect is not obtained. When the content of the curing accelerator is too high, the cured material obtained tends to discolor.

Examples of the antioxidant include antioxidants such as phenol compounds, amine compounds, organic sulfur compounds, and phosphine compounds.

Examples of the flame retardant include metal hydroxides such as magnesium hydroxide, bromine-compound flame retardants, nitrogen-compound flame retardants, and phosphorus-compound flame retardants. Also usable is a flame retardant aid such as antimony trioxide.

Examples of the modifier include conventionally known modifiers such as glycols, silicones, and alcohols.

Examples of the defoaming agent include conventionally known defoaming agents such as silicones.

The resin composition of the invention can be produced, for example, in the following manner. Namely, the ingredients A to D described above are mixed, and various optional additives are suitable further added thereto. Thereafter, these ingredients are kneaded together by means of a kneader or the like. The resultant mixture is pulverized or otherwise processed. Thus, a powdery resin composition can be produced.

It is preferred that the resin composition obtained above should give a cured material having a light reflectivity of 80% or higher at a wavelength of 450 nm to 800 nm. The upper limit of the light reflectivity thereof is 100%. The light reflectivity is measured, for example, in the following manner. A 1 mm-thick cured material of the resin composition is produced under a predetermined curing conditions, for example, molding at 150° C. for 4 minutes and subsequent curing at 150° C. for 3 hours. The reflectivity of this cured material at that wavelength can be measured with a spectrophotometer (e.g., Spectrophotometer V-670, manufactured by JASCO Corp.) at room temperature (25±10° C.).

The optical semiconductor device obtained using the resin composition of the invention is produced, for example, in the following manner. Namely, a metallic lead frame is disposed within a mold of a transfer molding machine, and the resin composition is used to form a resin wall formed from a resin layer by transfer molding. The resin wall is formed so as to surround the circumference of a region where an optical semiconductor element is to be mounted. Thus, a metallic lead frame for an optical semiconductor device is fabricated. Subsequently, an optical semiconductor element is mounted on the optical-semiconductor-element mounting region which is located on the metallic lead frame and inside the region surrounded by the resin wall, and wire bonding is conducted according to need. Thus, an optical semiconductor device which is a unit including a metallic lead frame 1 having a resin wall formed from a resin layer 3 so as to surround the circumference of an optical semiconductor element 2 to be mounted and the optical semiconductor element 2 mounted on the metallic lead from 1, such as, for example, that shown in FIG. 1, is fabricated. In the optical semiconductor device, the region which is located inside the resin wall formed from the resin layer 3 and includes the optical semiconductor element 2 is usually encapsulated with a silicone resin or the like.

Figure 2:
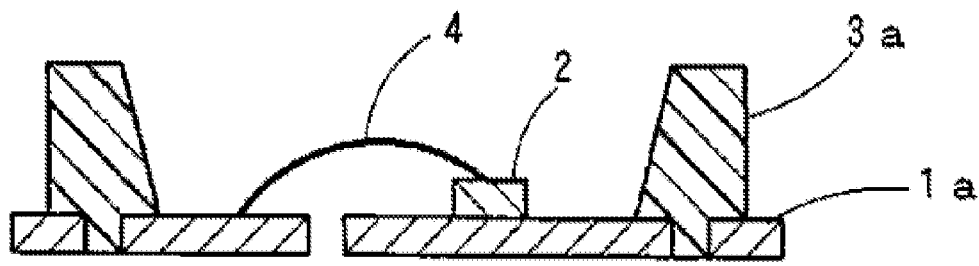
FIG. 2 is a sectional view diagrammatically illustrating another configuration of the optical semiconductor device of the invention.
Figure 3:
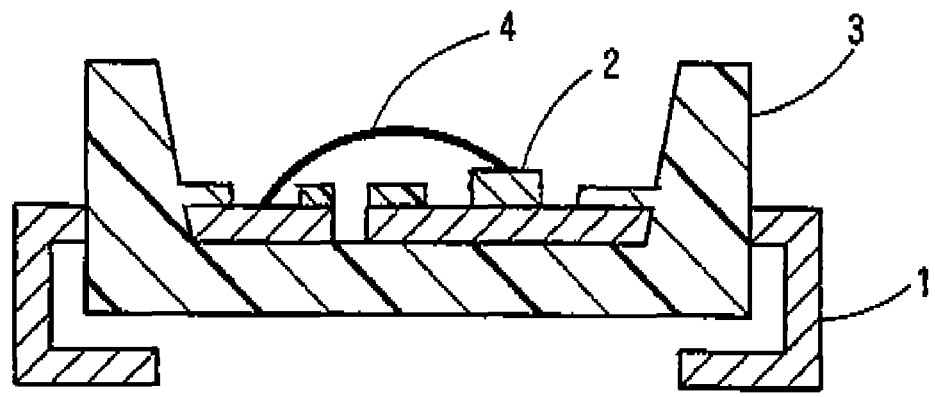
FIG. 3 is a sectional view diagrammatically illustrating still another configuration of the optical semiconductor device of the invention.
Figure 4:
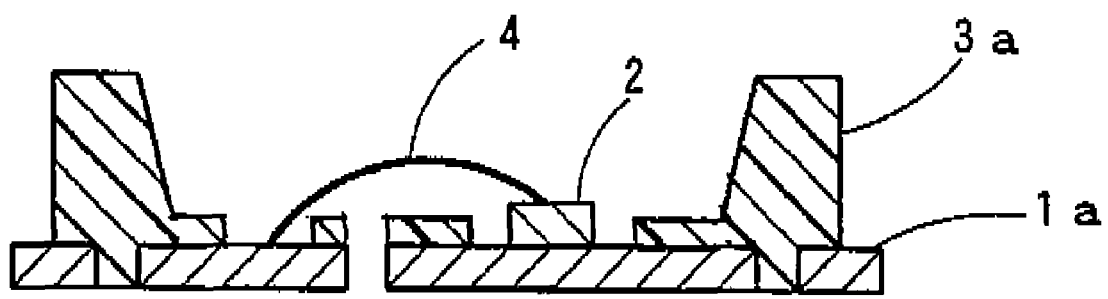
FIG. 4 is a sectional view diagrammatically illustrating a further configuration of the optical semiconductor device of the invention.

Other configurations of the optical semiconductor device are shown in FIG. 2 to FIG. 4. In the optical semiconductor device shown in FIG. 2, a resin wall 3a has been formed on the metallic lead frame 1a (or substrate) on which an optical semiconductor element 2 has been mounted. The optical semiconductor device shown in FIG. 3 has substantially the same configuration as the optical semiconductor device shown in FIG. 1. In the optical semiconductor device shown in FIG. 3, however, a resin is also formed at the circumference of the optical semiconductor element 2 on the metallic lead frame 1, which is located inside the region surrounded by the resin wall formed from the resin layer 3. The optical semiconductor device shown in FIG. 4 has substantially the same configuration as the optical semiconductor device shown in FIG. 2. In the optical semiconductor device shown in FIG. 4, however, a resin is also formed at the circumference of the optical semiconductor element 2 on the metallic lead frame 1, which is located inside the region surrounded by the resin wall 3a. In these configurations of an optical semiconductor device which are shown in FIG. 2 to FIG. 4, the same parts as in the optical semiconductor device shown in FIG. 1 are designated by the same signs.

In the optical semiconductor devices shown in FIG. 2 to FIG. 4 according to the invention, various substrates may be used in place of the metallic lead frames 1a. Examples of the various substrates include organic substrates, inorganic substrates, and flexible printed wiring boards. The metallic lead frames 1a of the optical semiconductor devices shown in FIG. 2 and FIG. 4 and such various substrates each have an electrode circuit (not shown) formed on the surface thereof.

Incidentally, in the present invention, there may be one or more of optical-semiconductor-element mounting regions on the lead flame (or various substrates), and the circumference of at least one of the optical-semiconductor-element mounting regions is surrounded by the resin wall.

EXAMPLES

Examples are given below together with Comparative Examples. However, the invention should not be construed as being limited to the following Examples.

First, prior to the production of resin compositions, the ingredients shown below were prepared.

Epoxy Resin a1: Triglycidyl isocyanurate (epoxy equivalent: 100)

Epoxy Resin a2: Bisphenol A diglycidyl ether (epoxy equivalent: 450)

Acid Anhydride Methylhexahydrophthalic anhydride (acid equivalent: 168)

Polyorganosiloxane c1

Into a flask were introduced 206 g (50 mol %) of phenyltrimethoxysilane and 126 g (50 mol %) of dimethyldimethoxysilane. A mixture of 1.2 g of 20% aqueous HCl solution and 40 g of water was added dropwise thereto. After completion of the dropwise addition, refluxing was continued for 1 hour. Subsequently, the resultant solution was cooled to room temperature (25° C.) and then neutralized with sodium hydrogen carbonate. The organosiloxane solution obtained was filtered to remove impurities, and low-boiling substances were then distilled off at a reduced pressure using a rotary evaporator to thereby obtain a liquid polyorganosiloxane c1. The polyorganosiloxane c1 obtained contained hydroxyl groups and alkoxy groups in an amount of 9% by weight in terms of OH group amount. The polyorganosiloxane c1 obtained was constituted of 50% by mole units A2 and 50% by mole units A3, and contained 33% phenyl groups and 67% methyl groups.

Polyorganosiloxane c2

In a flask, a mixed solvent was prepared beforehand by mixing 550 g of water, 150 g of methanol, and 150 g of toluene. Thereto was dropwise added, with vigorous stirring over 5 minutes, a mixture of 182.5 g (90 mol %) of methyltrichlorosilane, 17.5 g (10 mol %) of dimethyldichlorosilane, and 215 g of toluene. The internal temperature of the flask rose to 75° C., and the mixture in this state was continuously stirred for 10 minutes. The resultant solution was allowed to stand and cool to room temperature (25° C.). Thereafter, the aqueous layer which had separated was removed. Subsequently, water was mixed with the residue. This mixture was stirred and then allowed to stand, and the aqueous layer was removed. This water-washing operation was repeated until the toluene layer became neutral. The residual organic layer was continuously refluxed for 30 minutes to distill off the water and part of the toluene. The resultant toluene solution of an organosiloxane was filtered to remove impurities. Thereafter, the remaining toluene was distilled off at a reduced pressure using a rotary evaporator to thereby obtain a solid polyorganosiloxane c2. The polyorganosiloxane c2 obtained contained 6% by weight hydroxyl groups. The chlorosilanes used as starting materials had been wholly reacted, and the polyorganosiloxane c2 obtained was constituted of 10% by mole units A2 and 90% by mole units A3, and contained 100% methyl groups.

Titanium Oxide: Rutile-form; average particle diameter, 1.0 μm

Silica Powder Spherical fused silica; average particle diameter, 23 μm

Antioxidant: 9,10-Dihydro-9-oxa-10-phosphaphenanthrene 10-oxide

Curing Accelerator Tetra-n-butylphosphonium O,O-diethyl phosphorodithioate

Examples 1 to 9 and Comparative Examples 1 and 2

The ingredients shown in Table 1 and Table 2 shown later were put together according to each of the formulations shown in the tables, and were melt-mixed in a beaker. Each mixture was aged, subsequently cooled to room temperature, and pulverized. Thus, desired powdery epoxy resin compositions were produced.

The epoxy resin compositions of Examples and Comparative Examples thus obtained were evaluated for various properties by the following methods. The results thereof are also shown in Table 1 and Table 2 given later.

Light Reflectivity

Using each epoxy resin composition, test pieces having a thickness of 1 mm were produced under predetermined curing conditions (conditions: molding at 150° C. for 4 minutes and curing at 150° C. for 3 hours). The test pieces (cured materials) were examined for light reflectivity in the initial stage and after 150° C. standing for 168 hours. Spectrophotometer V-670, manufactured by JASCO Corp., was used as a measuring apparatus and the reflectivity of light having a wavelength of 450 nm was measured at room temperature (25° C.).

Light Degradation Resistance

Using each epoxy resin composition, test pieces having a thickness of 1 mm were produced under predetermined curing conditions (conditions: molding at 150° C. for 4 minutes and curing at 150° C. for 3 hours). The test pieces (cured materials) were irradiated using a 405 nm single-wavelength laser (NDHV310APC, manufactured by Nichia Kagaku Kogyo K.K.) under the conditions of 25 mW and 20 μm (80 W/mm$^2$). The light obtained by reflection from each cured material was received with a power meter (OP-2VIS, manufactured by Coherent Inc.) to measure the intensity thereof. The time period required for the intensity of the received light to decrease to 50% of the initial value thereof was measured and taken as light resistance life. When the results of the measurement were evaluated, the cases where the light resistance life obtained was 100 minutes or longer were rated as "good", and the cases where the light resistance life was shorter than 100 minutes were rated as "poor".

TABLE 1

|  | Example (parts by weight) | | | | | | | | |
|---|---|---|---|---|---|---|---|---|---|
|  | 1 | 2 | 3 | 4 | 5 | 6 | 7 | 8 | 9 |
| Epoxy resin a1 | 100 | 100 | 100 | 100 | 100 | 100 | 100 | 100 | 100 |
| Epoxy resin a2 | — | — | — | — | — | — | — | — | — |
| Acid anhydride | 152 | 152 | 152 | 152 | 152 | 152 | 152 | 152 | 152 |
| Polyorganosiloxane c1 | 15 | 30 | 30 | 65 | 170 | — | — | — | — |

TABLE 1-continued

| | Example (parts by weight) | | | | | | | | |
|---|---|---|---|---|---|---|---|---|---|
| | 1 | 2 | 3 | 4 | 5 | 6 | 7 | 8 | 9 |
| Polyorganosiloxane c2 | — | — | — | — | — | 15 | 30 | 65 | 170 |
| Titanium oxide | 180 | 250 | 200 | 220 | 290 | 220 | 250 | 220 | 290 |
| Silica powder | 90 | 125 | 100 | 110 | 145 | 110 | 125 | 110 | 145 |
| Antioxidant | 4 | 4 | 4 | 4 | 4 | 4 | 4 | 4 | 4 |
| Curing accelerator | 2.0 | 2.0 | 2.0 | 2.0 | 2.0 | 2.0 | 2.0 | 2.0 | 2.0 |
| Content of polyorgano-siloxane (wt %)* | 5.5 | 10.4 | 10.4 | 20.1 | 39.7 | 5.5 | 10.4 | 20.1 | 39.7 |
| Light reflectivity (%) Initial | 96 | 97 | 94 | 93 | 90 | 96 | 95 | 95 | 93 |
| Light reflectivity (%) 150° C. × 168 hr | 87 | 88 | 87 | 86 | 84 | 86 | 84 | 83 | 81 |
| Light degradation resistance | good | good | good | good | good | good | good | good | good |

*Content (wt %) based on all organic components.

TABLE 2

| | Comparative Example (parts by weight) | |
|---|---|---|
| | 1 | 2 |
| Epoxy resin a1 | 100 | — |
| Epoxy resin a2 | — | 100 |
| Acid anhydride | 152 | 40 |
| Polyorganosiloxane c1 | — | — |
| Polyorganosiloxane c2 | — | — |
| Titanium oxide | 200 | 70 |
| Silica powder | 100 | 15 |
| Antioxidant | 4 | 1 |
| Curing accelerator | 2.0 | 1.2 |
| Content of polyorgano-siloxane (wt %)* | — | — |
| Light reflectivity (%) Initial | 97 | 88 |
| Light reflectivity (%) 150° C. × 168 hr | 88 | 61 |
| Light degradation resistance | poor | poor |

*Content (wt %) based on all organic components.

The results given above show that the test pieces of the Examples gave high values with respect to each of initial light reflectivity and light reflectivity measured after long-term high-temperature standing. It can be seen that the test pieces of the Examples have excellent long-term high-temperature heat resistance. With respect to light degradation resistance also, these test pieces were rated good. It can hence be seen that the test pieces of the Examples have excellent light degradation resistance.

In contrast, the test pieces of Comparative Example 1, which had been produced without using a polyorganosiloxane, gave high values substantially equal to those of the Examples with respect to initial light reflectivity and light reflectivity measured after long-term high-temperature standing. With respect to the measurement of light degradation resistance, however, the test pieces of Comparative Example 1 had a light resistance life shorter than 100 minutes, showing that they had poor light degradation resistance. The test pieces of Comparative Example 2, which had been produced using no polyorganosiloxane and using bisphenol A diglycidyl ether as the only epoxy resin, showed a low light reflectivity after long-term high-temperature standing and poor long-term high-temperature heat resistance. With respect to the measurement of light degradation resistance also, the test pieces of Comparative Example 2 had a light resistance life shorter than 100 minutes, showing that they had poor light degradation resistance.

Subsequently, the powdery epoxy resin compositions obtained in the Examples each were used to produce an optical semiconductor device having the configuration shown in FIG. 1. Namely, a lead frame 1 made of Alloy 42 (plated with silver) was prepared on which an optical semiconductor element (size: 0.3 mm×0.3 mm) 2 had been mounted and in which an electrode circuit (not shown) formed on the metallic lead frame 1 had been electrically connected to the optical semiconductor element 2 with a bonding wire 4. Subsequently, this lead frame 1 was set in a transfer molding machine, and transfer molding was conducted to thereby produce an optical semiconductor device which was a unit including the metallic lead frame 1, the optical semiconductor element 2 mounted thereon, and a resin wall formed from a resin layer 3 on the metallic lead frame 1 so as to surround the optical semiconductor element 2, as shown in FIG. 1 (molding conditions: molding at 150° C. for 4 minutes and curing at 150° C. for 3 hours). The optical semiconductor devices thus obtained were satisfactory and had no problem.

While the invention has been described in detail with reference to specific embodiments thereof, it will be apparent to one skilled in the art that various changes and modifications can be made therein without departing from the spirit and scope thereof.

Incidentally, the present application is based on Japanese Patent Applications No. 2009-205752 filed on Sep. 7, 2009 and No. 2010-118513 filed on May 24, 2010, and the contents are incorporated herein by reference.

All references cited herein are incorporated by reference herein in their entirety.

The resin composition for optical semiconductor devices of the invention gives a cured material which has a high light reflectivity and can retain the reflectivity. The resin composition is hence useful as a material for forming a resin wall around the circumference of the optical semiconductor element of an optical semiconductor device.

DESCRIPTION OF REFERENCE NUMERALS AND SIGNS

1 Metallic lead frame
2 Optical semiconductor element
3 Resin layer
3a Resin wall
4 Bonding wire

What is claimed is:
1. An optical semiconductor device comprising a lead frame for an optical semiconductor device comprising one or more optical-semiconductor-element mounting regions and a resin wall,
wherein a circumference of at least one of said element mounting region is surrounded by the resin wall formed from a resin composition comprising the following ingredients (A) to (D): (A) an epoxy resin; (B) a curing agent; (C) a polyorganosiloxane; and (D) 2 to 90% by weight of a white pigment based on the entire resin composition; and an optical semiconductor element mounted on a predetermined position in the lead frame, wherein the resin wall does not contact the optical semiconductor element, wherein the ingredient (C) is contained in an amount of 5 to 60% by weight based on all organic components including the ingredients (A) to (C).

2. A lead frame for an optical semiconductor device, having one or more optical-semiconductor-element mounting regions and a resin wall, wherein a circumference of at least one of said element mounting region is surrounded by the resin wall formed from the resin composition for optical semiconductor devices, wherein the resin wall comprises (A) an epoxy resin; (B) a curing agent; (C) a polyorganosiloxane; and (D) a white pigment;

an optical semiconductor element mounted on a predetermined position in the lead frame, wherein the resin wall does not contact the optical semiconductor element, and wherein the ingredient (C) is contained in an amount of 5 to 60% by weight based on all organic components including ingredients (A) to (C).

3. An element comprising:

a resin layer comprising (A) an epoxy resin; (B) a curing agent; (C) a polyorganosiloxane; and (D) a white pigment;

an optical semiconductor element for a lead frame for an optical semiconductor device, wherein the resin layer surrounds the optical semiconductor element and does not contact the optical semiconductor element; and wherein the ingredient (C) is contained in an amount of 5 to 60% by weight based on all organic components including ingredients (A) to (C).

4. The element according to claim 3, wherein the resin layer has a light reflectivity of 80% or higher at a wavelength of 450 nm to 800 nm.

5. The element according to claim 3, wherein the ingredient (D) is titanium oxide.

6. The element according to claim 3, which further contains an inorganic filler in addition to the ingredients (A) to (D).

* * * * *